United States Patent [19]

Leberzammer et al.

[11] 4,353,978
[45] Oct. 12, 1982

[54] POLYMERIC BINDERS FOR AQUEOUS PROCESSABLE PHOTOPOLYMER COMPOSITIONS

[75] Inventors: Ernst Leberzammer, New Brunswick; Leo Roos, New Shrewsbury, both of N.J.

[73] Assignee: E. I. Du Pont de Nemours and Company, Wilmington, Del.

[21] Appl. No.: 225,724

[22] Filed: Jan. 16, 1981

Related U.S. Application Data

[60] Division of Ser. No. 66,374, Aug. 14, 1979, Pat. No. 4,273,857, which is a continuation of Ser. No. 654,171, Jan. 30, 1976, abandoned, which is a continuation-in-part of Ser. No. 463,310, Apr. 23, 1974, abandoned.

[51] Int. Cl.$^3$ .............................................. G03C 5/00
[52] U.S. Cl. ................................... 430/302; 430/260; 430/271; 430/300; 430/311; 430/313; 430/291; 430/314; 430/323
[58] Field of Search ................... 204/159.22, 159.16; 430/281, 282, 284, 286, 288, 271, 300, 291, 311, 260, 313, 372, 314, 323

[56] References Cited

U.S. PATENT DOCUMENTS

| | | | |
|---|---|---|---|
| 2,923,673 | 5/1958 | Munger | 204/158 |
| 2,927,022 | 7/1958 | Martin et al. | 430/281 |
| 3,469,982 | 8/1965 | Celeste | 430/281 |
| 3,765,898 | 10/1973 | Bauer et al. | 204/159.23 |
| 3,804,631 | 4/1974 | Faust | 204/159.16 |
| 3,833,384 | 9/1974 | Noonan et al. | 204/159.16 |
| 3,882,168 | 5/1975 | Klupfel et al. | 260/486 R |
| 3,887,450 | 6/1975 | Gilano et al. | 204/159.15 |

FOREIGN PATENT DOCUMENTS

| | | |
|---|---|---|
| 2123702 | 7/1961 | Fed. Rep. of Germany . |
| 2320849 | 9/1963 | Fed. Rep. of Germany . |
| 835849 | 5/1960 | United Kingdom . |

Primary Examiner—Jack P. Brammer

[57] ABSTRACT

Photopolymerizable compositions are described containing a polymerizable ethylenically unsaturated monomer, a photoinitiator or initiator system, and selected acidic polymeric binders. The organic binder mixture contains a compound chosen from each of two selected classes. These photopolymerizable compositions yield superior processability, i.e., on developing and stripping, in solely aqueous alkaline media devoid of organic solvents, decreased softness and/or tackiness, and improved adhesion when compared to the prior art. The compositions are particularly useful for preparing photoresists.

9 Claims, No Drawings

POLYMERIC BINDERS FOR AQUEOUS PROCESSABLE PHOTOPOLYMER COMPOSITIONS

RELATED APPLICATIONS

This is a division of application Ser. No. 066,374 filed Aug. 14, 1979, and now U.S. Pat. No. 4,273,857 which is a continuation of application Ser. No. 654,171, filed Jan. 30, 1976, now abandoned, which in turn is a continuation-in-part of application Ser. No. 463,310, filed Apr. 23, 1974, now abandoned.

BACKGROUND OF THE INVENTION

1. Field of the Invention

This invention pertains to photopolymerizable compositions, elements, and processes of photopolymerization. More particularly, it pertains to binders for such compositions and processes that yield improved photoresists processable, i.e., developable and strippable, by aqueous alkaline solutions devoid of organic solvents.

2. Description of the Prior Art

Photopolymerizable systems usually comprise monomer, binder and initiator components which are caused to react by imagewise exposure to radiant energy forming polymer with characteristics dependent on the physical properties of the matrix and the degree of polymerization, crosslinking, grafting to binder and consumption of any plasticizers (the monomer itself may perform this role). One method of readout involves physical differences between exposed and unexposed regions of the polymerizable layer distinguished by solubility; this physical property difference is used in a readout method using washoff with various solvents. Compositions of this kind and their use as photosensitive layers or elements are well known in the art.

A particularly useful application for photopolymerizable compositions lies in that area of technology known as photoresists. For example, it is known (e.g., U.S. Pat. No. 3,469,982), to prepare a film resist in the form of a photopolymerizable layer sandwiched between a cover sheet, (e.g., polyethylene film) and a temporary support. A machine is used to laminate the material to copper, copper-laminated board or other materials after the polyethylene film has been stripped off. The material is exposed through a process transparency using a suitable ultraviolet light source. Before or after exposure, the temporary support is stripped and the photopolymer layer subsequently treated with solvent to remove unexposed material. The tough polymerized layer (0.00005 to 0.005 in. or more thick, depending on product type) remaining on the metal, acts as a resist when the metal is treated with an appropriate etchant, for example, ferric chloride for copper. After etching, the photopolymerized material is removed with a stronger solvent at higher temperature, leaving a finished printed circuit.

Among the various methods of readout, dissolving away unexposed unpolymerized areas (i.e., developing) via a solvent is particularly important. Further, in photoresist technology, removal of the polymerized material (i.e., stripping) via a stronger solvent is usually required. Hence, the desirability of having light-sensitive photopolymerizable compositions which can be developed and stripped without the need of conventional organic solvents is manifest. Organic solvents are costly, may be hazardous with respect to toxicity and-/or flammability, may become scarce due to petrochemical shortages, and may pollute the air and water.

Now the advantages of such aqueous systems were noted as far back as 1956 in U.S. Pat. No. 2,760,863; however, no specific compositions were described. In spite of these obvious advantages and this 1956 disclosure, as the majority of the known art exemplifies, the developer and/or stripping solvents most frequently taught do contain an organic component, ranging from a small fraction of water-soluble organic compounds up to neat organic liquids, illustrating the fact that satisfactory, solely aqueous processable photopolymerizable compositions devoid of organic solvents, while desirable, are not readily attainable; the majority require an organic component for processing.

Several references do illustrate solely aqueous alkaline processable formulations; e.g., U.S. Pat. No. 2,893,868; 2,927,022; U.S. Pat. No. 3,765,898; U.S. Pat. No. 3,887,450; U.S. Pat. No. 3,833,384; and U.S. Pat. No. 3,804,631. However, the formulations described therein, while not without merit in some applications, still exhibit certain deficiencies, especially when used as photoresists. The usefulness of photopolymerizable compositions for dry film resists, which are laminated as a solid film to a substrate, depends on the proper balance of severable properties: aqueous development and stripping but resistance to treating solutions in the polymerized state; tackiness; adhesion to substrate; flexibility; and solubility in noncorrosive, nonflammable coating solvents, among others.

The high degree of tackiness of certain aqueous processable photopolymerizable resist compositions described in the art is a major deficiency. That is, tacky (sticky) photopolymerizable films can be expected to readily accept dirt, including air-borne dust, etc., which may yield "pinholes" in the resist. Further, tacky films present obvious potential problems involving lamination alignment during photoresist element preparation. Also, objectionable "pick-off" of tacky, unexposed, unpolymerized areas during delamination, due to adhesion of the sticky areas to the coversheet of a photoresist, may occur.

Soft, low melting compositions are likewise objectionable. On storage in rolls, flow can occur causing edges of the film to fuse together, lap to lap. If dirt or lint particles inadvertently get wound between the laps at manufacture, the localized pressure spots created cause the resist to flow leading to thin spots in the resist layer which will ultimately produce pinholes in printed circuit manufacture. During lamination, soft films flow excessively at temperatures required to develop adhesion leading to distortions in the laminated coating in the form of ripples of alternating thick and thin areas. Another defect occurs from the heat and pressure during exposure. Edges of the photographic film or masking material emboss the resist, creating thin areas.

Accordingly, the objectives of the instant invention are to provide improved photopolymerizable compositions which remedy the above listed deficiencies of the art compositions. While it may be expected that acidic binders will dissolve in aqueous alkali, it is surprising that including the novel binder combinations of this invention yield photopolymerizable compositions with appropriate adhesion and flexibility for photoresist applications, particularly with improved solely aqueous alkali processability and decreased tackiness and/or softness.

The above objectives, and others which will be apparent to those skilled in the art, are attainable using compositions defined hereinafter.

SUMMARY OF THE INVENTION

In accordance with this invention improved photopolymerizable compositions are provided which contain 0.1 to 10% by weight of an organic, radiation-sensitive, free radical generating photoinitiator system, 7.5 to 35% by weight of a nongaseous ethylenically unsaturated compound capable of forming a high polymer by free-radical initiated chain addition polymerization, and 30 to 92.4% by weight of polymer binder, the improvement wherein the binder comprises a mixture of 15 to 60% by weight of (A) an acidic, organic, film forming polymer
  (1) being insoluble in water at 85° F.,
  (2) having a molecular weight of at least 30,000,
  (3) having an acid number of at least 20, and
  (4) capable of forming a uniform coherent film on copper when cast from a volatile solvent and dried at normal room temperature, said film (a) ranging in thickness from 0.0003 to 0.0023 inch, (b) adhering to the copper such that zero delamination is found on a scribe cross-hatch test, and (c) dissolving completely within 5 minutes when sprayed with dilute aqueous alkali, 0.04 N NaOH, at 20 lbs/in$^2$ and 80° to 85° F.; and 15 to 60% by weight of (B) an acidic, organic polymer
  (1) being insoluble in water at 85° F.,
  (2) having an acid number of at least 5, and
  (3) in the form of a film ranging in thickness from 0.0003 to 0.0023 inch on copper being not completely soluble within 5 minutes when sprayed with dilute aqueous alkali, 0.04 N NaOH, at 20 lbs/in$^2$ and 80° to 85° F., all weight percentages being based on the weight of the total composition.

Photopolymerizable elements useful in accordance with the invention can be made by the conventional procedures disclosed in the prior art patents by coating a photopolymerizable stratum onto a thin, flexible film base or support, which preferably has a high degree of dimensional stability to temperature changes and drying the coated layer. In general, the film support will be chosen so that, at best, there is only a moderate amount or degree of adherence between the coating and the support.

A protective or cover sheet can be applied to the photopolymerizable layer after coating. This can be accomplished by a laminating step. Before applying the photopolymerizable film to the metal surface, the cover sheet is removed.

DESCRIPTION OF THE PREFERRED EMBODIMENTS

The present invention is based on the discovery that superior photopolymerizable compositions can be obtained using conventional initiators, monomers, etc., when combined with a mixture of selected acidic organic polymeric binders. The superiority observed for these compositions, over those previously known, is particularly manifest in their ease and completeness of development using dilute, solely aqueous alkaline agents, and in their improved (i.e., decreased or freedom from) tackiness and/or softness. These properties, plus those considered earlier as the objectives of this invention, connote utility particularly for photoresist applications. This use is augmented by the fact that the exposed portions of these compositions have satisfactory resistance to etching and plating solutions frequently encountered in the fabrication of printed circuits and chemically machined parts, and the appropriate flexibility and adhesion for photoresist applications. Critical to this discovery is the beneficial effect obtained on adding the selected binder mixture.

The Components of Photopolymerizable Compositions
Photoinitiator

The photopolymerizable composition must contain an organic, radiation-sensitive, free-radical generating system which initiates polymerization of the monomer and does not subsequently terminate the polymerization. The free-radical generating system should have at least one component that has an active radiation absorption band with a molar extinction coefficient of at least about 50 within the range of about 3400 to 7000 Å, and preferably 3400 to 5000 Å. "Active radiation absorption band" means a band of radiation which is active to produce the free radicals necessary to initiate polymerization of the monomeric material. The free-radical generating system can comprise one or more compounds which directly furnish free radicals when activated by radiation. It can also comprise a plurality of compounds, one of which yields free radicals after having been caused to do so by a sensitizer which is activated by the radiation.

A large number of such compounds can be utilized in the practice of this invention including aromatic ketones such as benzophenone, Michler's ketone (4,4'-bis-(dimethylamino)benzophenone), 4,4'-bis(diethylamino)-benzophenone, 4-methoxy-4'-dimethylaminobenzophenone, 2-ethylanthraquinone, phenanthraquinone, and other aromatic ketones; benzoin, benzoin ethers such as benzoin methyl ether, benzoin ethyl ether and benzoin phenyl ether, methylbenzoin, ethylbenzoin and other benzoins; and 2,4,5-triarylimidazole dimers such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer, and the like disclosed in U.S. Pat. No. 3,479,185, in British Pat. No. 1,047,569, published Nov. 9, 1966, and U.S. Pat. No. 3,784,557.

Useful initiators are the 2,4,5-triarylimidazole dimers (also known as hexaarylbiimidazoles). These are used with a free-radical producing electron donor agent, such as 2-mercaptobenzoxazole, leuco crystal violet or tris(4-diethylamino-2-methylphenyl)methane, which is preferred. Such sensitizers as Michler's ketone may be added. Various energy transfer dyes, such as Rose Bengal and Eosin Y, can also be used. Additional examples of suitable initiators are disclosed by Plambeck in U.S. Pat. No. 2,760,863. Other useful systems employ a triarylimidazole dimer and a free-radical producing electron donor agent, with or without the use of a sensitizing compound as described in U.S. Pat. No. 3,479,185 to Chambers. Another useful group of initiators are those mixtures described in U.S. Pat. No. 3,427,161.

The concentration of the free-radical generating system employed should be about 0.1–10% by weight based on total composition, and preferably about 0.2 to 5.0% by weight.

The Monomer

The instant invention is not limited to the use of any particular polymerizable monomer, it being required only that the monomer be ethylenically unsaturated and capable of addition polymerization. A large number of useful compounds is available, generally characterized by a plurality of terminal ethylenic groups. Among the suitable materials may be mentioned (a) various vinyl and vinylidene monomers, e.g., vinyl carboxylates, α-alkyl acrylates, α-substituted acrylic acids and esters thereof, vinyl esters, vinyl hydrocarbons, acrylic and α-substituted acrylic acid esters of the polymethylene glycols and ether alcohols, all as disclosed in Plambeck, U.S. Pat. Nos. 2,760,863 and 2,791,504; (b) the various compounds disclosed (col. 16, ll. 36 ff.) in Martin and Barney, U.S. Pat. No. 2,927,022, and especially those having a plurality of addition-polymerizable ethylenic linkages, particularly when present as terminal linkages, and more especially those wherein at least one and preferably most of such linkages are conjugated with a doubly bonded carbon, including carbon doubly bonded to carbon or to such heteroatoms as nitrogen, oxygen and sulfur; (c) esters of pentaaerythritol compounds of the kind disclosed in Celeste and Bauer, U.S. Pat. No. 3,261,686; and (d) compounds of the kind described in Cohen and Schoenthaler, U.S. Pat. No. 3,380,831, e.g., the reaction product of trimethylolpropane, ethylene oxide, and acrylic and methacrylic acids.

Many of the low molecular weight polymerizable components discussed previously, including both the mono- and polyethylenically unsaturated compounds, will normally contain, as obtained commercially, minor amounts (about 50–100 parts per million by weight) of polymerization inhibitors to prevent spontaneous thermally induced polymerization before desired. The presence of these inhibitors, which are usually of the antioxidant type, in such amounts causes no undesirable results in the practice of this invention, either as to speed or as to quality of polymerization. Among the suitable thermal polymerization inhibitors are p-methoxyphenol, hydroquinone, alkyl- and aryl-substituted quinones and hydroquinones, tert-butyl catechol, pyrogallol, copper resinate, naphthylamines, β-naphthol, cuprous chloride, 2,6-di-tert-butyl-p-cresol, phenothiazine, pyridine, nitrobenzene and dinitrobenzene, p-toluquinone, chloranil, and thiazine dyes, e.g., Thionine Blue G (C.I. 52025), Methylene Blue B (C.I. 52015), and Toluidene Blue O (C.I. 52040).

The concentration of the monomer or monomers employed should be about 7.5–35% by weight based on the total solids of the composition, and preferably between 15–25%.

Binders (A) and (B)

In brief, the advantages of the invention are obtained by using a preformed, compatible macromolecular polymeric binding agent mixture, the components thereof taken from two selected classes. The use of the mixtures defined herein completely eliminates the need for organic solvents in developing and stripping, yields photopolymerizable compositions with low tack, and provides highly chemical-resistant resists.

The binders used are critical to the success of this invention. Further, each binder component of the binder mixture must exhibit the critical properties set forth above.

Either of the binders (A) and (B) described above may be comprised of a plurality of polymers which are different but which comply with the respective criteria for binders (A) and (B). The polymer binders (A) and (B) are solid at room temperature. The (A) binders are film-forming, i.e., form a uniform, coherent film when coated from solution in an organic solvent and dried at room temperature. The (B) binders may, but need not, be film-forming. Hence, films of some (B) binders may not be uniform and coherent, e.g., due to wrinkling and cracks in the film, which is nevertheless sufficiently adherent to a copper surface on which it is formed.

Further criteria for binders (A) and (B) are that they are acidic and possess the minimum acid number set forth above. For binder (A) this value is at least 20 and for binder (B) this value is at least 5. The upper limit on the acid number does not appear to be critical but is limited by the solubility requirements for the particular polymeric binder. It is known that polymers possessing acid numbers of above about 700 are water soluble. Therefore the polymeric binders useful in this invention should not have acid numbers greater than in the range of about 550 to 600. In the case of binders (A) a preferred range is 20 to about 250 and binders (B) a preferred range is 5 to about 500.

Illustrations of binder (A) are set forth in Table I and illustrations of binder (B) are set forth in Table II.

TABLE I

| | Acidic Polymeric (A) Binders | | | |
|---|---|---|---|---|
| Polymers (Monomer Components)* | Acid[6] Number | Viscosity cps | Molecular Weight | Softening Point |
| A. Vinyl acetate (VA) 97% Crotonic acid (CA) 3% | 26 | 18–22[1] | >30,000 | 311° F.[7] |
| B. VA 95%, CA 5% | 38 | 9–11[1] | >30,000 | 253° F.[7] |
| C. VA 95%, CA 5% | 36 | 13–18[1] | >30,000 | 273° F.[7] |
| D. VA 97%, CA 3% | 23 | 14[2] | >30,000 | — |
| E. Cellulose acetate succinate degree acetylation 1.85 degree succinylation 0.42 (U.S. 2,923,673) | 136 | 1302[3] | >30,000 | — |
| F. Ethyl acrylate 56% Methyl methacrylate 37% Acrylic acid 7% | 76–85 | 325[4] | 260,000 | — |
| G. Similar to F | 60–70 | 14[5] | 30,000 | — |
| H. VA, CA, a benzophenone | 77 | 33[4] | 50,000 | — |

TABLE I-continued

| | Acidic Polymeric (A) Binders | | | |
|---|---|---|---|---|
| Polymers (Monomer Components)* | Acid[6] Number | Viscosity cps | Molecular Weight | Softening Point |
| J. Similar to F | 72 | 138[8] | — | 104° F.[9] |

*Shown for copolymers
(Legend)
[1]Measured with an Ostwald viscometer, 20° C., on an 8.6% solution in denatured (2B) alcohol.
[2]Brookfield viscosity (spindle No. 2, 60 rpm, 25° C.) 10% solution in methyl ethyl ketone (MEK).
[3]As in 2 above (but at 12 rpm), 17.5% solution in MEK (60%), methyl cellosolve (40%).
[4]As in 2 above, 10% solution in $CH_2Cl_2$.
[5]As in 4 above, 10% solution in $CH_2Cl_2$ (95%), isopropanol (5%).
[6]Accurately weigh approximately 1.0 gram of thoroughly dry product into a 250 cc. Erlenmeyer flask, add approximately 50 cc. ethanol and shake or heat to dissolve the polymer. Add about 10 drops phenolphthalein solution and titrate with 0.1N NaOH in methanol. Run duplicate samples. Acid number = (ml NaOH) (NaOH normality) (56.10)/Sample weight.
[7]Ball and ring method.
[8]Brookfield viscosity (spindle No. 2, 60 rpm, 25° C.)aqueous resin dispersion, 36% solids.
[9]Glass transition temperature.

Acidic binders illustrative of the second class (i.e., water insoluble, not necessarily good film formers but once a film is formed, for example by heat, etc., the film is not completely soluble in dilute aqueous alkali spray as described), from which another component of the inventive binder mixture must be selected, include the polymers of Table II.

TABLE II

| | Acidic Polymeric (B) Binders | | | |
|---|---|---|---|---|
| Polymer (Monomer Components)* | Acid[1] Number | Viscosity 10% Solution-cps | Molecular Weight | Softening Point, °C. |
| AA. Toluene sulfonamide Formaldehyde | 14 | 6[2] | — | 62 |
| BB. Methyl methacrylate (MMA) Methacrylic acid (MAA) | 9 | 14[3] | — | 96 |
| CC. MMA 68%, Ethyl acrylate 29% (EA) Methacryloxyethyl hydrogen maleate 3% | 8-9 | 16[3] | — | — |
| DD. Vinyl chloride (VC) 86% Vinyl acetate (VA) 13% Maleic acid (MA) 1% | | 14[2] | — | — |
| EE. VC 83%, VA 16%, MA 1% | 11 | 10[2] | — | — |
| FF. VC 81%, VA 17%, MA 2% | 26 | 10[2] | — | — |
| GG. Alcohol soluble fumaric acid modified rosin ester | 110-130 | 8[2] | — | 110-125 |
| HH. Styrene/Maleic anhydride resins (SMAn)(1:1) partially esterified with methanol | 320 | 24[4] | 50,000 | 220 |
| JJ. SMAn (1:1) unesterified | 480 | 8[2] | 1,600 | 150-170 |
| KK. SMAn (2:1) unesterified | 350 | 8[2] | 1,700 | 140-160 |
| LL. SMAn (1:1) Partially esterified with isopropanol | 270 | 13[3] | 1,700 | 160-170 |
| MM. SMAn (2:1) Similarly partially esterified | 220 | 6[2] | 1,900 | 135-150 |
| NN. SMAn (1:1) mono-isobutyl maleate | 180 | 13[4] | 20,000 | 210 |
| PP. SMAn (1.4:1) partially esterified with sec-butyl maleate | 190 | 8[2] | 10,000 | 190 |
| QQ. MMA 92% MAA 8% | 59 | 16[5] | 70,000 | — |
| RR. MMA 77% EA 15% MAA 8% | 50 | 30[5] | 100,000 | — |
| SS. MMA 56% EA 28% MAA 16% | 106 | 30[5] | — | — |
| TT. MMA 45% EA 45% MAA 10% | 70 | 30[5] | — | — |
| UU. Alkali-soluble thermoplastic resin-modified aliphatic polyester resin | 130 | 14[3] | — | 152 |
| VV. MMA 82% MAA 18% | 119 | 7.5[6] | — | — |
| WW. EA, MMA, acrylonitrile, acrylic | | | | |

TABLE II-continued

| | Acidic Polymeric (B) Binders | | | |
|---|---|---|---|---|
| Polymer (Monomer Components)* | Acid[1] Number | Viscosity 10% Solution-cps | Molecular Weight | Softening Point, °C. |
| acid, zinc crosslinked | 73 | 30[7] | — | 65[8] |

(Legend)
[1] See note (6), Table I.
[2] See note (2), Table I, but 10% in acetone.
[3] As (2) above, 10% in $CH_2Cl_2$.
[4] See note (2), Table I.
[5] As (2) above, solvent 90% $CH_2Cl_2$, 10% $CH_3OH$.
[6] This value is the relative viscosity of the polymer; the relative viscosity of the polymers RR, SS, and TT is 11.4, 27 and 15.5, respectively.
[7] Brookfield viscosity (spindle No. 2, 60 rpm, 25° C.) aqueous resin dispersion, 40% solids.
[8] Minimum film forming temperature.

As noted repeatedly herein, the principal utility envisaged for the novel compositions of the invention lies in photoresist applications, particularly in allowing developing and stripping with aqueous alkaline solutions free from organic solvents. Hence, it is surprising that binder (B), present in amounts varying from 15–60%, by weight, is itself required to be insoluble as a film in a dilute caustic spray which may subsequently be used to develop the photoresist film. Of course, in the photopolymerizable composition, containing major components initiator, monomer, and binders (A) and (B) and any optional minor components, the entire unpolymerized film area of the resist is readily soluble or dispersible under solely aqueous alkaline development to yield a clean, scum-free surface.

Binders which are particularly useful in the compositions of the present invention are vinyl addition polymers containing free carboxylic acid groups, which are preferably prepared from 30 to 94 mole percent of styrene or one or more alkyl acrylates and 70 to 6 mole percent of one or more α,β-ethylenically unsaturated carboxylic acids. Suitable alkyl acrylates for use in preparing these polymeric binders include methyl acrylate, ethyl acrylate, propyl acrylate, butyl acrylate, methyl methacrylate, ethyl methacrylate, butyl methacrylate, etc. Suitable α,β-ethylenically unsaturated carboxylic acids include acrylic acid, methacrylic acid, crotonic acid, maleic acid or anhydride and the like.

These polymeric binders can be prepared by any of the addition polymerization techniques known to those skilled in the art, which include solution polymerization, bulk polymerization, bead polymerization, emulsion polymerization, etc., in the presence of a free radical generating polymerization initiator, such as peroxy compounds, e.g., benzoyl peroxide, di(tertiary amyl) peroxide, or diisopropylperoxy carbonate, azo initiators, e.g., 1,1'-azodicyclohexanecarbonitrile, 2,2'-azobis(2-methylpropionitrile), and the like.

The polymerization reaction can be carried out in the presence of an inert solvent. Preferably, a low molecular weight alcohol which is a good chain transfer agent, e.g., ethyl alcohol, is used to promote formation of lower molecular weight polymers by a solution polymerization technique. Molecular weight can also be controlled by varying the temperature (the higher the initial temperature, the lower the molecular weight) or by varying the amount of catalyst used (the more catalyst, the lower the molecular weight.) Preferably, the polymerization reaction is performed in an inert atmosphere, e.g., under a blanket of nitrogen. The polymerization mixture is maintained at a temperature at which the polymerization initiator generates free radicals. The exact temperature selected depends on the monomers being polymerized, the particular initiator being used, and the molecular weight desired. Temperatures ranging from room temperature or lower up to about 100° C. are suitable. It is usually desirable to carry the polymerization reaction substantially to completion so that no unpolymerized monomers remain and the proportions of each component in the final product are substantially those of the original monomer mixture.

The polymeric binders can be collected and purified by conventional techniques, such as precipitation into a nonsolvent for the polymer followed by washing and drying. Further, many suitable binders are commercially available, providing another advantage for this invention.

Optional Components

Dyes

Small quantities of a dye may be present in the composition. This optional component is essentially for convenience purposes, i.e., to aid the user to locate the position and presence of the residual polymerized portion, after the unpolymerized zone has been dissolved away. The dye incorporated preferably should not absorb excessive amounts of radiation at the exposure wavelength or inhibit the polymerization reaction.

Among the dyes useful in the invention are Fuchsine (C.I. 42510), Auramine Base (C.I. 41000B), Calcoid Green S (C.I. 44090), Para Magenta (C.I. 42500), Tryparosan (C.I. 42505), New Magenta (C.I. 42520), Acid Violet RRL (C.I. 42425), Red Violet 5RS (C.I. 42690), Nile Blue 2B (C.I. 51185), New Methylene Blue GG (C.I. 51195), C.I. Basic Blue 20 (C.I. 42585), Iodine Green (C.I. 42556), Night Green B (C.I. 42115), C.I. Direct Yellow 9 (C.I. 19540), C.I. Acid Yellow 17 (C.I. 18965), C.I. Acid Yellow 29 (C.I. 18900), Tartrazine (C.I. 19140), Supramine Yellow G (C.I. 19300), Buffalo Black 10B (C.I. 27790), Naphthalene Black 12R (C.I. 20350), Fast Black L (C.I. 51215), Ethyl Violet (C.I. 20350), Ethyl Violet (C.I. 42600), and Solvent Red (C.I. 109), and C.I. Basic Blue 7 (C.I. 42595).

Adhesive Aids

When the inventive photosensitive compositions are applied to metals for use in photoresist applications, an adhesive aid is frequently added to the composition. Useful adhesive aids, which may be incorporated, include the monomeric or polymeric organic silanes, and the nitrogen containing heterocyclic compounds, e.g., benzotriazole, disclosed in Jones, U.S. Pat. No. 3,645,772, issued Feb. 29, 1972, and Hurley et al., U.S. Pat. No. 3,622,234, issued Nov. 23, 1971.

In addition, other ingredients such as plasticizers, fillers, etc., also may be present as is well known in the art.

Preparation of Elements

As previously indicated, the several components of the photosensitive compositions will ordinarily be mixed together in a material that is a solvent for all of the components. The particular solvent used is not critical; it merely affords a practical method of obtaining coatings or self-supporting films of the compositions. Representative of solvents that may be used, but in no way limiting are 2-propanone, 2-butanone, 2-pentanone, 1,2-dichloroethane, methyl acetate, dichloromethane, trichloromethane, and ethyl acetate.

In practicing a preferred embodiment of the invention, an element containing an image-yielding photopolymerizable stratum is made by coating a layer of a photopolymerizable composition disclosed herein on a suitable film support. After drying the photopolymerizable stratum, there is laminated to the surface thereof a removable cover film. The photopolymerizable composition is coated to give a dry coating thickness of about 0.0003 inch. A suitable support film may be chosen from a wide variety of films composed of high polymers, e.g., polyamides, polyolefins, polyesters, vinyl polymers, and cellulose esters and may have a thickness of from 0.00025 inch to 0.008 inch or more. If exposure is to be made before removing the support film, it must, of course, transmit a substantial fraction of the actinic radiation incident upon it. If the support film is removed prior to exposure, no such restrictions apply. A particularly suitable film is a transparent polyethylene terephthalate film having a thickness of about 0.001 inch. Suitable removable cover films may be chosen from the same group of high polymer films described above and may have the same wide range of thicknesses. A cover film of 0.001 inch thick polyethylene is especially suitable. Support and cover films as described above provide good protection to the photopolymerizable resist layer. To apply the resist to, say, a copper-clad fiber glass rigid support to be used as a printed circuit, the cover film is stripped from the element and the resist layer on its supporting film is then laminated with heated resilient pressure rolls to the copper surface of the rigid support. This provides a sensitized surface ready immediately for exposure but still protected from dirt, lint and abrasion by virture of the original support film. To produce a resist image the element is exposed imagewise through the support film and said film is then peeled off and the exposed resist developed by washing away the unexposed areas with dilute aqueous alkali which results in a rigid support bearing a relief resist image on its surface. This element may then be subjected to the conventional operations of plating, etching, etc. as is well known to those skilled in the arts using resist images.

The Process

The preferred process of this invention for forming photoresists on metal or other surfaces, including glass, ceramics, etc., comprises:

(1) applying to a surface the surface of a photopolymerizable composition as defined herein having a thickness of at least 0.00005 inch and low to moderate adherence to a thin, flexible, polymeric film support (e.g., 0025-0.008 inch or more); preferably with heating or later heating at a temperature from 40° C. to about 150° C. to increase the degree of adherence between said surface and said layer; then, in either order, (2) exposing the layer, imagewise, to actinic radiation to form a polymeric image; and (3) stripping the film support from the resulting image-bearing layer;

(4) washing away the unexposed areas of the layer to form a resist image of polymeric material with aqueous alkaline solutions devoid of organic solvents;

(5) permanently modifying the adjacent areas on said surface which are unprotected by the resist image by using a reagent capable of etching said areas or depositing a material on said areas.

The surface can then be treated with a suitable reagent to form an etched surface, or plated or processed in other ways. The polymeric image can then be removed by means of a caustic aqueous solution devoid of organic solvent with or without the aid of mechanical action, e.g., by rubbing, brushing and/or abrading, etc., or by a combination of one or more such steps.

This process is useful for making decorative photoengravings and chemically milled and electro-formed elements.

The etchable metal surface may be magnesium, zinc, copper, alloys of such metals, aluminum, anodized and dyed anodized aluminum, steel, steel alloys, beryllium-copper alloys.

Since free-radical generating addition-polymerization initiators activatable by actinic radiation generally exhibit their maximum sensitivity in the ultraviolet range, the radiation source should usually furnish an effective amount of this radiation. Both point and broad radiation sources are effective. Such sources include carbon arcs, xenon arcs, mercury vapor arcs, fluorescent lamps with ultraviolet radiation emitting phosphors, argon glow lamps, electronic flash units and photographic flood lamps. Of these, the xenon and mercury-vapor arcs, particularly the sunlamps, are most suitable. The sunlamp mercury-vapor arcs are customarily used at a distance of one and one-half to 24 inches from the photopolymerizable layer. The point sources are generally used at a distance of 20 up to about 40 inches from the photopolymerizable element. It is noted, however, that in certain circumstances it may be advantageous to expose with visible light, using a photoinitiator sensitive in the visible region of the spectrum. In such cases, the radiation source should furnish an effective amount of visible radiation. Many of the radiation sources listed above furnish the required amount of visible light.

The photopolymerizable compositions after exposure can be developed, e.g., by impingement of spray jets, with agitated immersion brushing or scrubbing to desirable images with aqueous bases, i.e., aqueous solutions of water-soluble bases in concentrations generally in the range from 0.01% to 10% by weight.

Suitable bases for the development include the alkali metal hydroxides, e.g., lithium, sodium and potassium hydroxide; the base-reacting alkali metal salts of weak acids, e.g., lithium, sodium, and potassium carbonates and bicarbonates; ammonium hydroxide and tetra-substituted ammonium hydroxides, e.g., tetramethyl-, tetraethyl- trimethylbenzyl-, and trimethylphenylammonium hydroxides, sulfonium hydroxides, e.g., trimethyl-, diethylmethyl-, dimethylbenzylsulfonium hydroxides, and the basic soluble salts thereof, e.g., the carbonates, bicarbonates and sulfides; alkali metal phosphates and pyrophosphates, e.g. sodium and potassium triphosphates and sodium and potassium pyrophosphates; tetra-substituted (preferably wholly alkyl) phosphonium, arsonium, and stibonium hydroxide, e.g., tetramethylphosphonium hydroxide.

The photopolymerized compositions can generally be removed by immersion in heated aqueous solutions of strong alkalies or, if desired, in proprietary stripping formulas well known in the art.

Utility

The basic advantage of the invention is that it provides a solely aqueous developable photopolymerizable system with low tack particularly useful as photoresists as described in the earlier cited U.S. Pat. No. 3,469,982. Further, the invention provides a fast system with good resolution, adhesion, and a tough, flexible photopolymer. Development is readily carried out and, if a dyed resist film is used, produces a dyed image directly without a separate dyeing operation. Dyed layers also facilitate inspection at any stage of the process. The photoresist layers sandwiched between two polymeric films after manufacture can easily be stocked as inventory and easily handled without damage until ready for use. The manufacture of the sandwiched photoresist element is easily carried out with high precision on the continuous web coating machinery well known in the photographic manufacturing industry.

In the process of the present invention, coatings of the resist on its supporting film can be made on precision continuous web coating machinery capable of highly uniform application over large areas. Dryers can remove all solvent from the coatings before the web is wound up. These operations, if carried out under clean conditions, especially if a cover film is laminated to the resist coating, can produce extremely high quality, dirt-free resist coatings which are completely protected in the sandwich form until use. This also facilitates thorough inspection during manufacture. To make a resist image on, for example, a metal support such as copper, it is only necessary to strip off the laminated cover film and laminate the uncovered surface of the photoresist layer to the metal support. The resist layer is still protected from lint, dust and other kinds of harmful dirt as well as from abrasion, scratches, etc. by the original support film. At the same time, it can be easily exposed through said film.

While this invention is particularly applicable to photoresists, it will be obvious to one skilled in the art that the advantages discovered can be beneficial in alternate photopolymer applications involving solvent wash-out. For example, the inventive compositions may be used to provide a photopolymerizable coating on aluminum for a lithographic plate as described by, among others, Alles, U.S. Pat. No. 3,458,311.

The invention will be further illustrated by, but is not intended to be limited to the following examples, wherein parts and percentages are by weight unless otherwise noted.

EXAMPLES 1–29

These examples describe the delamination test, and solubility test used to classify the acidic organic polymers as (A) or (B) binders. The binders were dissolved in an organic solvent, coated onto copper via a doctor blade, and air-dried. The dried coating thickness was measured; also, qualitative estimates of the coatings' film forming capability were noted. Quantitative adhesion and solubility data were also obtained on the coated samples. Adhesivity (anchorage) was determined using a delamination test; solubility was measured using a wash-off test, both described in detail below.

For photopolymerizable compositions to be useful as photoresists, they need to adhere at least moderately well to a substrate, e.g., copper. Since the binders are normally the major component of photopolymer compositions, it follows that the binders themselves should possess adequate adhesion (anchorage) to the substrate, e.g., copper. Now a convenient method for determining adhesivity of such a laminated structure (i.e., binder layer coated on copper) is to measure the degree of delamination, i.e., the degree to which the organic binder layer or film is removable from the substrate. Tests of this type are well known in the art, e.g., U.S. Pat. No. 3,615,557, Ex. I; indeed, a similar procedure was used.

Using a template, the dried binder/copper laminate described above was scored with a knife, through the binder layer, to yield ⅛ by ⅛ inch squares. A piece of cellophane, pressure-sensitive, adhesive tape is then pressed down over the scored area and a loose end of the tape grasped at about a 90° angle to the film surface. The tape is pulled up briskly and the number of squares remaining on the copper counted. By comparing the number of squares on the adhesive tape after its brisk removal, versus the original number of squares scored (usually around 50), the percentage delamination can be readily calculated.

Development of typical photoresist films usually requires removing unexposed, unpolymerized areas from copper via a solvent. Again, since binders are usually the major component of photoresist, the binder layers themselves should usually be readily dissolved or dispersed from substrate (e.g., copper). Thus, the time required to completely wash-off the binder layer from the binder/copper laminate, using dilute aqueous NaOH (0.04 N, 0.16%) spray at 80°–85° F., was determined. The laminates were mounted on an oscillating plate, six inches from spray nozzles; a pump was used to eject the spray at 20 lbs./in$^2$. The holes in the nozzles used will pass a 5/64" drill, but will not pass a 3/32" drill. The nozzles used were obtained from Spraying System Co., 3201 Randolph Street, Bellwood, Illinois. The nozzles used were No. ⅛ GG 6 SQ.

The data obtained for the binders listed in Table I and II, per the above tests, are summarized in Table III.

TABLE III

Delamination and Wash-off of Binder/Copper Laminates

| Ex. No. | Binder Code Tables I, II | Film Thickness ($\times 10^3$ inch) | Remarks | Delamination (%) | Wash-Off (Seconds) |
|---|---|---|---|---|---|
| 1 | A | 0.94 | Film Forming | 0 | 180 |
| 2 | B | 0.70 | Film Forming | 0 | 20 |
| 3 | C | 0.76 | Film Forming | 0 | 35 |
| 4 | D | 2.22 | Film Forming | 0 | 60 |
| 5 | E | 0.41 | Film Forming | 0 | 30–40 |
| 6 | F | 0.61 | Film Forming | 0 | 40–50 |
| 7 | G | 0.8 | Film Forming | 0 | 15 |
| 8 | H | 0.65 | Film Forming | 0 | 30 |
| 9 | J | 0.87 | Film Forming | 0 | 10 |
| 10 | AA | 0.70 | Film Forming | 100 | >300 |

TABLE III-continued

Delamination and Wash-off of Binder/Copper Laminates

| Ex. No. | Binder Code Tables I, II | Film Thickness ($\times 10^3$ inch) | Remarks | Delamination (%) | Wash-Off (Seconds) |
|---|---|---|---|---|---|
| 11 | BB | 0.44 | Film Forming | 0 | >300 |
| 12 | CC | 0.65 | Film Forming | 0 | >300 |
| 13 | DD | 0.29 | Film Forming | 0 | >300 |
| 14 | EE | 0.67 | Film Forming | 0 | >300 |
| 15 | FF | 0.37 | Film Forming | 0 | >300 |
| 16 | GG | 1.13 | Brittle Coating | 100 | >300 |
| 17 | HH | 0.63 | Film Forming | 0 | >300 |
| 18 | JJ | No Test | Brittle, Flaky | No Test | No Test |
| 19 | KK | No Test | Brittle, Flaky | No Test | No Test |
| 20 | LL | 1.12 | Brittle, Cracks | No Test | >300 |
| 21 | MM | 0.58 | Brittle Film | 100 | >300 |
| 22 | NN | 0.64 | Film | 0 | >300 |
| 23 | PP | 0.55 | Film | 0 | >300 |
| 24 | QQ | 0.61 | Film | Trace | >300 |
| 25 | RR | 0.72 | Film | Trace | >300 |
| 26 | SS | 0.80 | Film | 0 | >300 |
| 27 | TT | 0.32 | Film | 0 | >300 |
| 28 | UU | 0.52 | Brittle Film | 100 | >300 |
| 29 | WW | No Test | Brittle, Flaky | No Test | No Test |

Controls I-XVIII

The following control experiments were conducted as representative of the prior art; i.e., comprising only a single acidic organic binder. Their performance as photoresists, developable in solely aqueous alkaline solutions, was ascertained; this performance should be compared with the inventive compositions, the subsequent Examples.

Electrical printing circuits were prepared from the following solutions:

| Components | Grams |
|---|---|
| Triethylene glycol dimethacrylate | 20 |
| Benzophenone | 4 |
| Michler's ketone | 0.2 |
| Victoria Pure Blue BO | 0.1 |
| Binder | 75.7 |

Copper clad, epoxy-fiber glass boards were cleaned by scouring with an abrasive cleaner, swabbing and thoroughly rinsing in water, then dried with air jets.

The photopolymerizable resist compositions were coated, using a 0.006 inch doctor knife opening, onto 0.001-inch thick polyethylene terephthalate transparent film, then dried in air. Each resist coating with its support was laminated to the clean copper with the surface of the photopolymerizable layer in contact with the copper surface. The lamination was carried out with the aid of rubber covered rollers operating at 100°–115° C. with a pressure of 3 pounds per lineal inch at the nip, at a rate of 2 feet per minute. The resulting sensitized, copper clad board protected as it is by the polyester film, could be held for later use if need be. Actually it was exposed to light through a high-contrast transparency image in which the conducting pattern appeared as transparent areas on one opaque background. The exposure was carried out by placing the sensitized copper clad board (with its polyester film still intact) and the transparency into a photographic printing frame. The radiation (exposure) source was a scanning mercury arc (Scanex II, Colight Co., Minneapolis, Minn.); exposure occurred under (25") vacuum. After exposure, the polyethylene terephthalate polyester support film was peeled off and discarded leaving the exposed resist adherent to the copper surface. The board was then developed by placing it in a spray of 0.04 N NaOH, at 80°–85° F., at 20 lbs/in² as described in the preceding Examples. This step left the Pure blue BO colored resist on the copper in the pattern of the clear areas of the exposing transparency and should leave no resist in the complementary opaque areas.

The boards with a polymeric image were placed in a Model 315 Conveyorized Spray Etcher, made by Chemcut Div. of Centre Circuits Inc., State College, Pa. The etching apparatus contained a 45° Baume ferric chloride solution at 130° F. The element was left in the etching apparatus until the copper was completely etched away in the areas not covered by the resist image. The etched board was rinsed in water and dried, leaving the resist covered copper conducting pattern on the fiber glass board. The resist was finally removed from the copper by 1–3 minute immersion in 3% NaOH at 130° F.

The binders tested, organic coating solvents used, resist thickness, exposure time, development time, etching performance, and other observations, are reported in Table IV.

TABLE IV

Control Resists Performance

| Control No. | Binder Code Table I, II | Coating Solvent | Co-solvent | Resist Thickness ($\times 10^{-3}$ in) | Exposure Time (sec) | Development Time (sec) | Etching | Remarks |
|---|---|---|---|---|---|---|---|---|
| I | A | $CH_3COC_2H_5$(MEK) | — | 0.98 | 60 | 300 | ok | Tacky |
| II | B | $CH_2CL_2$(92.5) | $CH_3OH$(7.5) | 1.08 | 60 | 30 | ok | Soft, indentations |
| III | C | $CH_2CL_2$(92.5) | $CH_3OH$(7.5) | 1.18 | 75 | 30 | ok | Tacky |
| IV | E | MEK(60) | Methyl Cellosolve(40) | 0.88 | 90 | 25 | ok | Monomer exudes, Poor adhesion |
| V | F | $CH_2Cl_2$(92.5) | $CH_3OH$(7.5) | 1.18 | 60 | 30 | ok | Tacky, soft; ripple marks on lamination |

TABLE IV-continued

Control Resists Performance

| Control No. | Binder Code Table I, II | Coating Solvent | Co-solvent | Resist Thickness ($\times 10^{-3}$in) | Exposure Time (sec) | Development Time (sec) | Etching | Remarks |
|---|---|---|---|---|---|---|---|---|
| VI | G | $CH_2Cl_2$(85) | i-$C_3H_7OH$(15) | 1.08 | 75 | 30 | ok | Tacky, pressure marks |
| VII | H | $CH_2Cl_2$(92.5) | $CH_3OH$(7.5) | 1.08 | 75 | 30 | ok | Soft |
| VIII | AA | MEK | — | 0.60 | — | — | — | Very tacky coating, no film formed |
| IX | CC | $CH_2Cl_2$ | — | 1.08 | 60 | >300 | — | — |
| X | EE | MEK | — | 1.08 | 60 | >300 | — | — |
| XI | GG | $CH_2Cl_2$ | — | 1.18 | 60 | 30 | ok | Laminated at 25° C. soft, ripple marks |
| XII | HH | MEK | — | 0.98 | 60 | >300 | — | — |
| XIII | HH | Acetone | — | 1.18 | 60 | >300 | — | — |
| XIV | LL | $CH_2Cl_2$(92.5) | $CH_3OH$(7.5) | 1.08 | — | — | — | Very brittle film; no adhesion to copper on lamination. |
| XV | PP | MEK | — | 1.08 | — | — | — | Results identical to LL |
| XVI | SS | $CH_2Cl_2$(92.5) | $CH_3OH$(7.5) | 1.08 | 60 | 30 | Poor (Scummed) | — |
| XVII | UU | MEK | — | 1.08 | 60 | 30 | OK | Soft, ripple marks; required lamination at 25° C. |
| XVIII | VV | $CH_2Cl_2$(92.5) | $CH_3OH$(7.5) | 1.38 | 60 | >300 | — | — |

EXAMPLES 30–51

Photopolymerizable compositions, illustrative of this invention, were prepared and evaluated as resists exactly as described for the control experiments. All coating compositions contained monomer (20 g) and a dye, Victoria Pure Blue BO (0.1 g). The other components, and the results observed, are summarized in Table V.

In Table V, the following abbreviations have been used:
TDMA=triethylene glycol dimethacrylate
TMPTA=trimethylol propane triacrylate
PETA=pentaerythritol tri- and tetraacrylate, approx. 60:40
BP=benzophenone
MK=Michler's ketone, 4,4'-bis(dimethylamino)benzophenone
HABI=2-o-chlorophenyl-4,5-diphenylimidazolyl dimer (2,2'-bis(o-chlorophenyl)-4,4',5,5'-tetraphenylbiimidazole).
Leuco dye=tris-(4-N,N-diethylamino-o-tolyl)methane
2-Aq=2-tert-butylanthraquinone
2-EtAq=2-ethylanthraquinone
MEK=methyl ethyl ketone

TABLE V

Invention Resist Performance

| Example No. | Monomer (20g) | Binder(C) Code(g) (Table I) | Binder(D) Code(g) (Table II) | Photoinitiator System(g) | Coating Solvent(g) | Resist Thickness ($\times 10^{-3}$ in) | Exposure Time (sec) | Develop Time (sec) | Etching |
|---|---|---|---|---|---|---|---|---|---|
| 30 | TDMA | F(30) | LL(45.7) | BP(4); MK(0.2) | $CH_2Cl_2$(200) | 1.18 | 60 | 30 | ok |
| 31 | " | F(15.7) | LL(60) | " | $CH_2Cl_2$(200) | 1.08 | 90 | 30 | " |
| 32 | " | B(60) | SS(15.7) | " | $CH_2Cl_2$(185)/$CH_3OH$(15) | 1.18 | 60 | 30 | " |
| 33 | " | C(60) | PP(15.7) | " | $CH_2Cl_2$(200) | 0.98 | 90 | 30 | " |
| 34 | " | E(45) | AA(30.7) | " | MEK(127) Methyl cellosolve(85) | 0.98 | 30 | 30 | " |
| 35 | " | A(55) | GG(20.7) | " | MEK(200) | 0.98 | 40 | 40 | " |
| 36 | " | A(50) | GG(25.7) | " | MEK(200) | 1.08 | 50 | 30 | " |
| 37 | " | B(60) | EE(15.7) | " | MEK(200) | 1.08 | 60 | 60 | " |
| 38 | " | G(55) | CC(20.7) | BP(4); MK(0.2) | As Ex. 35 | 1.08 | 105 | 180 | " |
| 39 | " | B(60) | AA(15.7) | " | Acetone(200) | 0.98 | 60 | 90 | " |
| 40 | TMPTA | " | " | HABI(4) Leuco dye(0.4) | Acetone(200) | 0.98 | 60 | 150 | " |
| 41 | PETA | " | AA(18.3) | 2-Aq(1.6) | Acetone(200) | 0.98 | 180 | 105 | " |
| 42 | TDMA | H(15.7) | LL(60) | BP(4); MK(0.2) | $CH_2Cl_2$(200) | 1.05 | 90 | 60 | " |
| 43 | " | B(15.7) | " | " | $CH_2Cl_2$(200) | 0.98 | 75 | 90 | " |
| 44 | " | C(60) | EE(15.7) | " | $CH_2Cl_2$(200) | 1.03 | 60 | 60 | " |
| 45 | " | G(30) | PP(45.7) | " | MEK(187) i-$C_3H_7OH$(13) | 0.87 | 75 | 30 | " |
| 46 | " | A(25) | LL(50.7) | " | MEK(200) | 0.98 | 40 | 90 | " |
| 47 | PETA | B(60) | AA(19.5) | 2-EtAq(0.4) | Acetone(200) | 0.98 | 180 | 100 | " |
| 48 | " | " | AA(19.1) | 2-EtAq(0.8) | Acetone(200) | 1.08 | 180 | 105 | " |
| 49 | TDMA | H(15.7) | UU(60) | BP(4); MK(0.2) | $CH_2Cl_2$(200) | 1.08 | 75 | 30 | " |
| 50 | " | A(55) | UU(20.7) | " | $CH_2Cl_2$(185)/$CH_3OH$(15) | 1.18 | 60 | 30 | " |
| 51 | " | A(60) | UU(15.7) | " | $CH_2Cl_2$(185)/ | 1.08 | 60 | 30 | " |

TABLE V-continued

| | | Invention Resist Performance | | | | | | | |
|---|---|---|---|---|---|---|---|---|---|
| Example No. | Monomer (20g) | Binder(C) Code(g) (Table I) | Binder(D) Code(g) (Table II) | Photoinitiator System(g) | Coating Solvent(g) | Resist Thickness ($\times 10^{-3}$ in) | Exposure Time (sec) | Develop Time (sec) | Etching |
| | | | | | $CH_3OH(15)$ | | | | |

In addition to the data of Table V, the following remarks regarding resist performance further illustrate the advantages observed for the compositions of this invention:

| Example | Remarks |
|---|---|
| 30 | Flexible, adherent, non-tacky film; no ripplemarks on lamination |
| 31 | Same as Ex. 30 |
| 32 | No softness, no indentations, no scumming |
| 33 | Flexible, non-tacky film, good adhesion |
| 34 | Non-tacky film, good adhesion, no monomer exudation |
| 35 | No ripple marks during lamination |
| 36 | Same as Ex. 35 |
| 37 | No scumming, no softness |
| 38 | Non-tacky film, no ripple or pressure marks |
| 39 | Non-tacky film, no softness or indentations |
| 40 | Same as Ex. 39 |
| 41 | Same as Ex. 39 |
| 42 | Flexible, adherent film, no softness or indentations |
| 43 | Same as Ex. 42 |
| 44 | Non-tacky film developed without scum |
| 45 | Flexible, adherent film, no tackiness, softness, or indentations. |
| 46 | Non-tacky film with good adhesion to copper |
| 47 | Same as Ex. 39 |
| 48 | Same as Ex. 39 |
| 49 | No softness on ripple marks. |
| 50 | No ripple marks during lamination |
| 51 | Same as Ex. 50 |

EXAMPLE 52

A photopolymerizable composition was prepared containing

| | |
|---|---|
| copolymer of methyl methacrylate and methacrylic acid (binder BB) | 1.8 g |
| polymethylmethacrylate, mol. wt. 258,000 | 1.5 g |
| plasticizer of triethylene glycol dicaprate and dicaprylate mixture | 0.8 g |
| trimethylolpropanetriacrylate | 3.4 g |
| 10% solution in ethyl cellosolve of terpolymer of ethyl acrylate, methyl-methacrylate, and acrylic acid (binder F) | 18.0 g |
| Michler's Ketone | 0.1 g |
| trichloroethylene solvent | 100.0 g |
| ethyl cellosolve | 43.0 g |
| o-chloro-hexaarylbiimidazole | 0.4 g |

The above solution was coated on a polyester film support and dried to give a layer approximately 0.0005 inch thick. The dried layer was a uniform, coherent film which was non-tacky. The layer was imagewise exposed for 30 seconds with a xenon arc and developed in an alkaline, aqueous solution comprising a 10% solution of sodium carbonate in water, the developer solution being devoid of any organic component. The unexposed areas were completely removed by the developer leaving the exposed, polymerized areas on the support.

EXAMPLE 53

This example illustrates using a composition of the invention as a transferable gravure stencil resist film.

An aqueous photopolymerizable coating solution was prepared to yield a dried layer containing the following ingredients:

| | |
|---|---|
| Binder J (in an aqueous dispersion) | 55.0% |
| Binder WW (in an aqueous dispersion) | 25.0% |
| Triethylene glycol dimethacrylate | 17.0% |
| Benzophenone | 2.0% |
| Michler's Ketone | 0.40% |
| C. I. Solvent Red 49 | 0.45% |
| C. I. Basic Green 4 | 0.15% |

The aqueous coating solution (33% solids) also contained 2-ethoxyethanol (2% of the coating solution) as the coalescing solvent.

The above composition was coated, using the above solution via an extrusion die, onto a thin gelatin substratum which had been overcoated on the sub layer of a 0.007 inch thick (0.178 mm.) polyethylene terephthalate clear film support, prepared as described in Example IV of assignee's Alles, U.S. Pat. No. 2,779,684, containing an insoluble resin sub layer on one side only. The reverse side of the support had, further, been coated with an antistatic layer comprised of polysilicic acid. After coating and hot air drying, the dried photopolymerizable layer was 0.0005 inch (0.013 mm.) thick. A 0.0005 inch thick (0.013 mm.) clear, biaxially oriented and heat-set polyethylene terephthalate film removable cover sheet was then laminated over the photopolymerizable layer, using pressure rollers, to yield a composite element.

A 2 inch by 9 inch sample of the element was imagewise exposed through the cover sheet and a hard dot, halftone, contact, positive transparency to a source of ultraviolet radiation (Addalux ® light source having a 5000 watt mercury vapor lamp) reduced by 50% and at a distance of 5 feet for 105 seconds. The cover sheet was partially delaminated from the leading edge of the exposed element, and the leading edge of the support was taped to the surface of a copper cylinder which has been conventionally cleaned as disclosed in U.S. Pat. No. 3,879,204. The surface of the cylinder was wetted with a 2:1 water-isopropanol solution, and the imaged photopolymerizable surface was then laminated to the wetted copper surface by rotating the cylinder with the taped element thereon under a pressure roller exerting a pressure of 30 lbs. per lineal inch at a surface speed of 3 feet per minute and simultaneously delaminating the remaining portion of the cover sheet.

After ten minutes the support was removed from the laminated resist layer, and the layer was developed by rotating the cylinder with the laminate resist thereon into a 1% aqueous sodium carbonate monohydrate solution for 45 seconds at a surface speed of 3 feet per minute. The cylinder with the resist stencil thereon was then rinsed with water and dried with forced warm air.

Conventional touch up and staging of the laminated cylinder was carried out to correct artifact and to protect segments of the cylinder from etching using a conventional asphaltum staging solution. A 0.1% aqueous sodium carbonate solution was then applied to the laminated surface. After a water rinse, the laminated cylinder was immediately etched by a powderless etching process by spraying the cylinder surface rotating at a speed of 60 feet per minute for 80 seconds to a 40° Bé photoengravers acid containing additives similar to those described in German Pat. No. 1,285,829 at 80° F. and spray pressure of 1.4 Kp/cm². This etching gave a 50% shadow well depth of 30 to 35 microns. After etching was complete the etched cylinder was rinsed with water. The asphaltum staging was removed with naphtha, and the resist was stripped from the etched cylinder by first treating with dilute ammonia followed by a water rinse. After conventional preparatory steps such as polishing and chrome plating, the cylinder having an intaglio pattern of the contact transparency in the surface was ready for gravure printing.

A high quality gravure plate was also prepared by a process like that above except that the resist image was developed before it was laminated to a copper plate. In this instance the cover sheet was completely removed after exposure, and the resist on the support was developed for 45 seconds with a developer similar to that described above. The developed resist layer was then laminated to the wetted plate also as described above. In addition to isopropanol-water solutions, other alcohol solutions such as ethanol-water as well as water alone can be used to apply the resist layer to the cylinder surface.

I claim:

1. A process for forming a photoresist on a surface comprising:
   (1) applying to a surface the surface of a photopolymerizable layer on a film support, said photopolymerizable layer formed from a photopolymerizable composition containing 0.1 to 10% by weight of an organic radiation-sensitive free radical-generating photoinitiator system, 7.5 to 35% by weight of a nongaseous ethylenically unsaturated compound capable of forming a high polymer by free radical-initiated chain addition polymerization, and 30 to 92.4% by weight of polymeric binder wherein the binder is comprised of a mixture of from 15 or 60% by weight each of two free acid containing polymers which are insoluble in water at 85° F., the first polymer (A)
      (a) being film forming when cast from solution in volatile solvent onto copper after evaporation of the solvent, the film having (1) the thickness of 0.0003 to 0.0023 inch; (2) good adhesion to copper as measured by zero delamination in the scribe cross hatch test; and (3) complete solubility within five minutes to a spray of dilute aqueous alkali at 0.04 normal NaOH, 20 p.s.i., and 80°–85° F.;
      (b) having a molecular weight of at least 30,000; and
      (c) having an acid number of at least 20; and the second polymer (B)
         (1) having an acid number of at least 5; and
         (2) when in film form of 0.0003 to 0.0023 inch thickness, being insoluble for at least 5 minutes to a spray of dilute aqueous alkali at 0.04 normal NaOH, 20 p.s.i., and 80°–85° F.; then, in either order,
   (2) exposing the layer, imagewise, to actinic radiation to form a polymeric image; and
   (3) stripping the film support;
   (4) washing away the unexposed areas of the photopolymerizable layer to form a resist image of polymeric material with an alkaline, aqueous solution; and
   (5) permanently modifying the adjacent areas on said surface which are unprotected by the resist image by using a reagent capable of etching said areas or depositing a material on said areas.

2. A process according to claim 1 wherein either or both polymeric binder components (A) and (B) are comprised of a plurality of polymers.

3. A process according to claim 1 wherein polymeric binder component (A) is a copolymer of vinyl acetate and crotonic acid.

4. A process according to claim 1, wherein polymeric binder component (A) is a terpolymer of ethyl acrylate, methyl methacrylate, and acrylic acid.

5. A process according to claim 1 wherein polymeric binder component (A) is cellulose acetate succinate.

6. A process according to claim 1 wherein polymeric binder component (B) is selected from the group consisting of toluene sulfonamide formaldehyde, a copolymer of methyl methacrylte and methacrylic acid, a copolymer of methyl methacrylate, ethyl acrylate and hydrogen maleate, a terpolymer of vinyl chloride, vinyl acetate and maleic acid, a copolymer of styrene and maleic anhydride, a terpolymer of methyl methacrylate, ethyl acrylate and methacrylic acid and a tetrapolymer of ethyl acrylate, methylmethacrylate, acrylonitrile and acrylic acid zinc crosslinked.

7. A process according to claim 4 wherein polymeric binder component (B) is a copolymer of styrene and maleic anhydride.

8. A process according to claim 1 wherein the acid number of polymeric binder component (A) ranges from 20 to about 600 and the acid number of polymeric binder component (B) ranges from 5 to about 600.

9. A process according to claim 1 wherein the acid number of polymeric binder component (A) ranges from 20 to about 250 and the acid number of polymeric binder component (B) ranges from 5 to about 500.

* * * * *